US010333496B2

(12) United States Patent
Juntunen et al.

(10) Patent No.: US 10,333,496 B2
(45) Date of Patent: Jun. 25, 2019

(54) TUNING OF FILTERS (71) Applicant: Nokia Solutions and Networks Oy, Espoo (FI)

(72) Inventors: Tero-Anssi Juntunen, Oulu (FI); Veikko Sakari Lukkari, Oulu (FI); Marko Tapio Oskari Isomaki, Oulunsalo (FI); Timo Markus Karhu, Shanghai (CN); Tuomo Teuvo Tapani Raty, Oulu (FI); Jarno Mikael Holopainen, Oulu (FI); Kimmo Kalervo Karhu, Oulu (FI); Jukka Kilpelainen, Oulu (FI)

(73) Assignee: Nokia Solutions and Networks Oy, Espoo (FI)

( * ) Notice: Subject to any disclaimer, the term of this patent is extended or adjusted under 35 U.S.C. 154(b) by 141 days.

(21) Appl. No.: 15/511,899

(22) PCT Filed: Oct. 27, 2014

(86) PCT No.: PCT/EP2014/072977
§ 371 (c)(1),
(2) Date: Mar. 16, 2017

(87) PCT Pub. No.: WO2016/066183
PCT Pub. Date: May 6, 2016

(65) Prior Publication Data
US 2017/0250678 A1 Aug. 31, 2017

(51) Int. Cl.
*H03J 3/12* (2006.01)
*H01P 1/205* (2006.01)
(Continued)

(52) U.S. Cl.
CPC ............... *H03J 3/12* (2013.01); *H01P 1/201* (2013.01); *H01P 1/2053* (2013.01); *H01P 1/2056* (2013.01); *H03J 3/00* (2013.01)

(58) Field of Classification Search
CPC ..... H03J 3/12; H03J 3/00; H01P 1/201; H01P 1/2056; H01P 1/2053
(Continued)

(56) References Cited

U.S. PATENT DOCUMENTS 6,504,446 B1  1/2003  Ishihara et al. ............. 333/17.1
6,750,733 B1  6/2004  Dunsmore et al. .......... 333/17.1
(Continued)

FOREIGN PATENT DOCUMENTS

CN       102473991 A      5/2012
WO   WO 2009/000862 A2   12/2008
WO   WO 2013/147524 A1   10/2013

OTHER PUBLICATIONS

Macchiarella, G., et al., "Extraction of Unloaded Q and Coupling Matrix From Measurements on Filters with Large Losses", IEEE Microwave and Wireless Components Letters, vol. 20. No. 6, Jun. 2010, 3 pgs.

*Primary Examiner* — Robert J Pascal
*Assistant Examiner* — Jorge L Salazar, Jr.
(74) *Attorney, Agent, or Firm* — Harrington & Smith (57) ABSTRACT There is provided a method, including obtaining information indicating at least one reference characteristic; obtaining input data, the input data relating to the output of the tunable filter; determining, based on the input data, at least one characteristic of the tunable filter; upon detecting that the at least one determined characteristic does not match with the at least one reference characteristic, determining tuning instructions for the tunable filter; and applying the tuning instructions in adjusting the tunable filter.

21 Claims, 5 Drawing Sheets (51) Int. Cl.
*H03J 3/00* (2006.01)
*H01P 1/201* (2006.01)

(58) Field of Classification Search
USPC .................. 333/17.1, 202–209, 222–233
See application file for complete search history.

(56) References Cited

U.S. PATENT DOCUMENTS 6,791,430 B2 * 9/2004 Borzenets ........... H01P 1/20336
333/17.1
2003/0122635 A1 7/2003 Borzenets et al. .............. 333/99

* cited by examiner

TUNING OF FILTERS

FIELD OF THE INVENTION

The invention relates generally to tuning of filters.

BACKGROUND

There are many types of radio frequency (RF) and microwave filters. The filters form an important element within a variety of scenarios by passing desired frequencies and rejecting undesired frequencies. Before usage, the filter may need to be tuned to specification. However, often the tuning is a cumbersome and time-consuming task. Therefore, a solution is needed to make the tuning process more efficient.

BRIEF DESCRIPTION OF THE INVENTION

The invention is defined by the independent claims.

Some embodiments of the invention are defined in the dependent claims.

LIST OF THE DRAWINGS

In the following, the invention will be described in greater detail with reference to the embodiments and the accompanying drawings, in which.

DESCRIPTION OF EMBODIMENTS

The following embodiments are exemplary. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

A radio frequency (RF) or a microwave frequency filter is an important element in any radio receiver or radio transmitter. The filter may be used to output a signal having only a desired frequency range, whereas in receivers, the incoming signal may need to be filtered from unwanted frequencies. There may be different types of filters, comprising a low pass filter (passing only frequencies below a cut-off frequency), a high pass filter (passing only frequencies above the cut-off frequency), a band pass filter (passing only signals on a certain frequency band/spectrum) and a band-stop filter (passing only frequencies that are not on the stop-band). The solution proposed below may be applied to any type of filters, either in a receiver or in a transmitter.

Different products may have different requirements for the allowed frequency range, be it the output frequency (transmitter) or the input frequency (receiver). Therefore, each time a filter is used in a radio device, tuning of the filter may be required. Typically antenna filter tuning is manual work using a screw driver manually, reliant on operator skills and long learning curve. The manual tuning may comprise a person analysing the filter current status and making a decision on how the performance needs to be adjusted to make filter to compliant with specification. Tuning times are long and differ between products on the basis of difficulty and architecture. As an example, it may be mentioned that for 3-pipe duplex RF filters, average tuning times are generally at a level of 100 minutes. Other known solutions (such as time domain, neuro network, fuzzy logic and group delay tunings) are slow and inaccurate. Thus, typically the tuning is a cumbersome and time-consuming task. Therefore, a solution is needed to make the tuning process more efficient.

Figure 1:
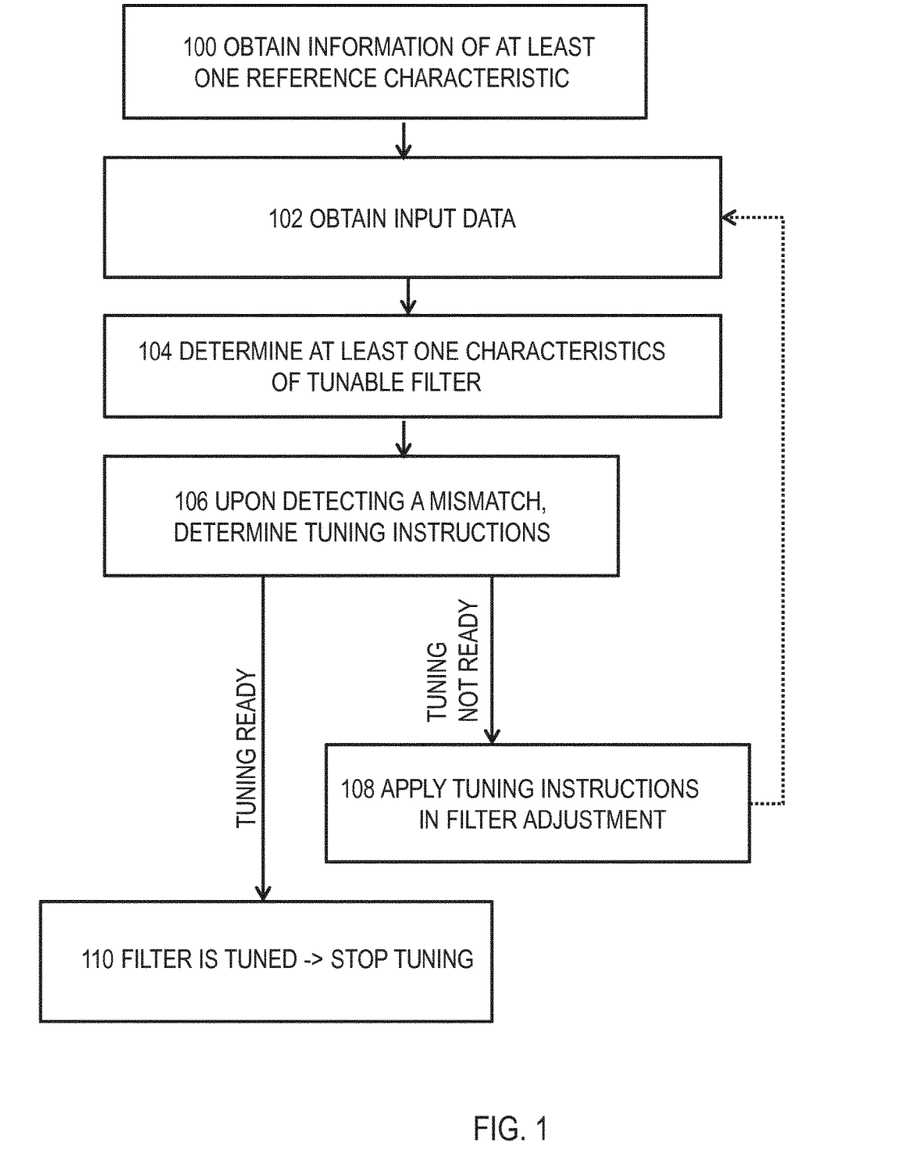
FIG. 1 presents a method according to an embodiment.

Accordingly, there is proposed a generic, automated filter tuning process in which a machine tuning algorithm analyses the status of a given filter (i.e. a tunable filter) and automatically makes a decision on how the performance needs to be adjusted to make filter to compliant with the specification. FIG. 1 depicts a method which may be performed by a control apparatus 200 of FIG. 2. The other accompanying Figures may provide further embodiments by describing the method of FIG. 1 in details. The control apparatus 200 may be a laptop, a palm computer, a smart phone, a personal computer, a server, or, in general, any computing device which is capable of receiving inputs, processing data and providing outputs.

Figure 2:
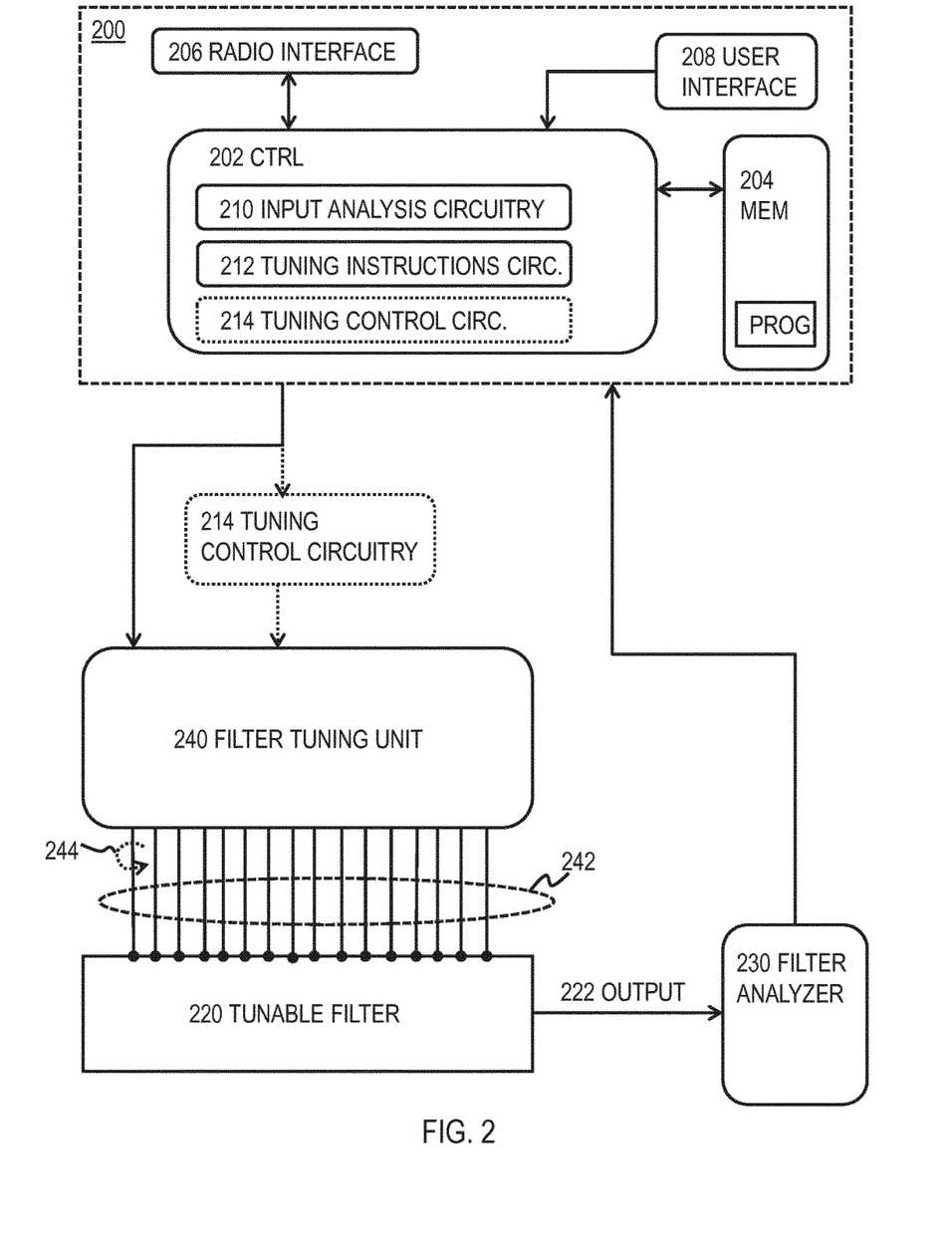
FIG. 2 shows a system according to an embodiment.

As shown in FIG. 2, the proposed control/tuning apparatus 200 may be coupled to a filter analyser 230, such as a network analyser or a spectrum analyser. The filter analyser 230 may analyse an output 222 of a tunable filter 220 and provide results to the control apparatus 200. In an embodiment, the filter analyser 230 is comprised in the control apparatus 200, although depicted as a separate physical entity in FIG. 2.

The control apparatus 200 may also be coupled to a filter tuning unit 240, which may be for performing the actual tuning (adjustment) of the filter 220 by using motors for rotating tuning elements of the filter 220, as will be described later. In one embodiment, however, the filter tuning unit 240 may be comprised in the control apparatus 200, although not shown in FIG. 2.

Let us first take a look at the method of FIG. 1. In step 100, it is proposed that the control apparatus 200 obtains information indicating at least one reference characteristic. In an embodiment, the reference characteristic/model may be extracted from the design parameters of the filter 220 under tuning. That is, the product specification of the filter 220 may define the at least reference characteristic. However, in an embodiment, the reference characteristic is obtained from a reference filter. The reference filter, or a so-called golden unit, may be a filter which has been previously tuned according to given specifications to produce an acceptable reference output. The reference filter thus outputs a desired frequency response, including only the desired output frequencies and excluding all unwanted output frequencies. However, it may be noted that there may be leakage of unwanted frequencies even in the golden unit, as immediate cut-off may be impossible to achieve. The reference filter may have been previously tuned in a laboratory, for example. The reference characteristic may then be used in comparison with the tunable filter 220, in order to tune the tunable filter 220 according to the reference filter. The at least one reference characteristic may be any characteristic that represents or affects to the performance of the reference filter. In an embodiment, the at least one reference characteristics comprises a reference coupling matrix of the reference filter.

In step 102, the control apparatus 200 may obtain input data. In an embodiment, the input data is received from the filter analyser 230. In an embodiment, the filter analyser 230 is a network analyser. The filter analyser 230 may analyse the output 222 of the tunable filer 220. Thus, the input data received by the control apparatus 200 from the filter analyser 230 may relate to the output 222 of the tunable filter 220.

In one embodiment, the input data from the filter analyser 230 comprises parameters of a time-domain-reflectometer (TDR) measurement. In one embodiment, the input data from the filter analyser 230 comprises at least one measured scattering parameter S of the output 222 of the tunable filter 220. The scattering parameters, or S-parameters, may represent electrical properties of a network of components (such as a filter comprising a plurality of resonators). The S-parameters may be measured at the output ports of the filter 220. In one embodiment, the input data comprises an S-parameter matrix describing an N-port network. The s-parameter matrix may be a square matrix having a dimensions N×N. Each element, or S-parameter, of the matrix may be represented by a unitless complex number that represents amplitude and phase. In an embodiment, the input data comprises S-parameters $S_{11}$ and $S_{21}$ of the filter 220, representing amplitude and phase.

In step 104, the control apparatus 200 may then determine, based on the received input data from the filter analyser 230, at least one characteristic of the tunable filter 220. The determined characteristic may of the same type as the reference characteristics. This characteristic(s) may then be compared against the reference characteristic(s). Let us alter look at deriving the characteristic(s) from the input data.

In step 106, upon detecting that the at least one determined characteristic does not match with the at least one reference characteristic, the control apparatus 200 may determine tuning instructions for the tunable filter 220, and, in step 108, apply the tuning instructions in adjusting the tunable filter 220. This may comprise, e.g., outputting the tuning instructions to the filter tuning unit 240, which may be responsible of tuning the filter 220 according to the tuning instructions. In case the at least one determined characteristic matches with the at least one reference characteristic according to a predetermined tuning accuracy, the control apparatus 200 may consider that the tuning of the filter 220 is accomplished and, thus, continue to step 110 instead of step 108. Consequently, the control apparatus 200 may stop the tuning. Turning instructions may define how a given tuning element of the filter 220 is to be adjusted, i.e. define needed corrections for the filter 220. For example, there may be many tuning screws in the filter 220 and the tuning instructions may define which of the screws are to be adjusted (i.e. rotated) and how much.

Figure 3:
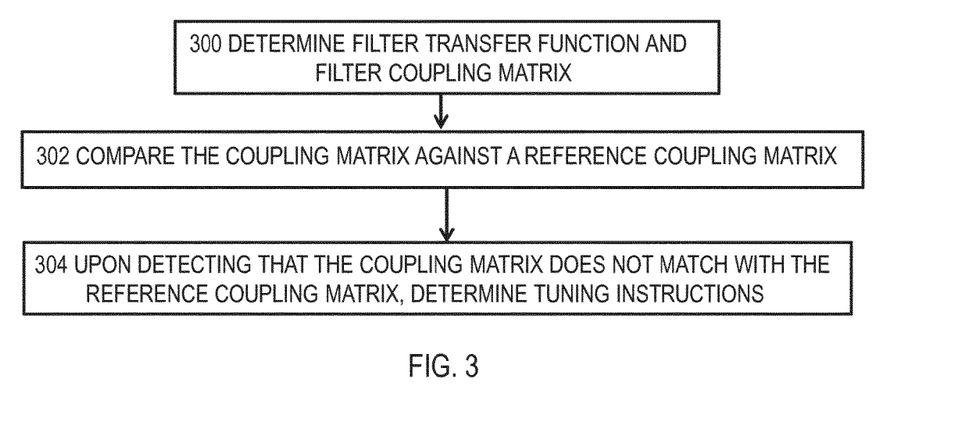
FIG. 3 shows a method according to an embodiment.
Figure 4:
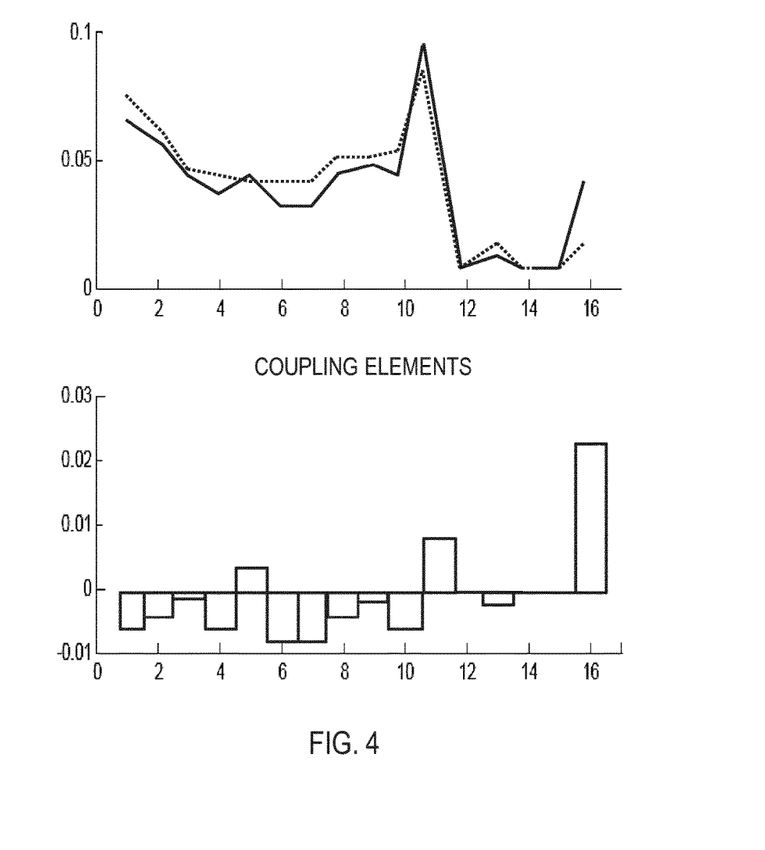
FIG. 4 illustrates comparison of a tunable filter and a reference filter, according to an embodiment.
Figure 5A:
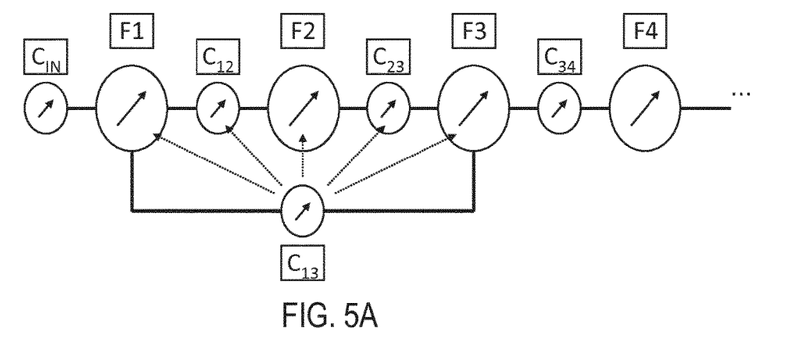
FIGS. 5A to 5C show examples on interrelationships between tuning parameters, according to some embodiments.
Figure 5B:
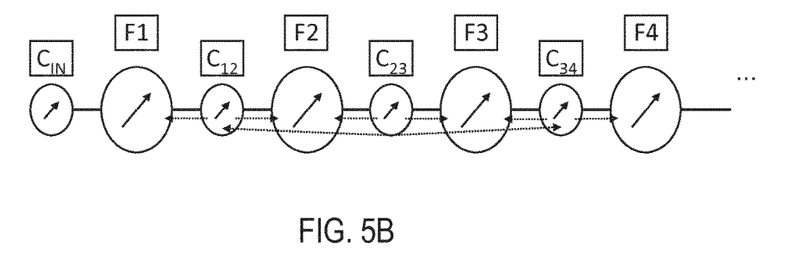
Figure 5C:
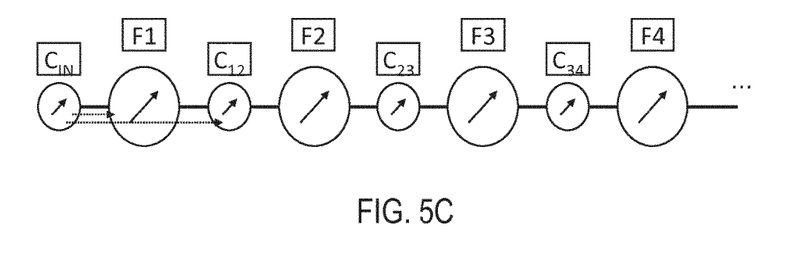

Let us now take a more detailed look at how the decision to adjust the filter 220 is done with reference to FIGS. 3 to 5. As said, in step 104 the control apparatus 200 may determine at least one characteristic of the tunable filter 220. FIG. 3 depicts one embodiment on how this characteristic is determined. In step 300, the control apparatus 200 may determine, based on the input data from the filter analyser 230, a filter transfer function. In one embodiment, the filter transfer function may be derived from the S-parameters received from the filter analyser 230. That is, the filter transfer function may be fitted to the S-parameter data. This may be done with least square fitting—technique, for example, and/or by a known technique known as a Cauchy method. In one embodiment, the filter transfer function is a polynomial function, such as a parabola or a hyperbola.

Further in step 300, the control apparatus 200 may determine, as the at least one characteristic, a filter coupling matrix on the basis of a structure (defining e.g. topology) of the tunable filter 220 and the filter transfer function. This may denote that the filter transfer function is transformed into a correct shape filter coupling matrix (which matches with the structure of the filter 220). The filter topology defines e.g. inputs, outputs, number of stages (i.e. resonators) and couplings between those. It may be noted that different kinds of filter coupling matrices may produce the same filter transfer function, but only one filter coupling matrix matches with the filter design/topology/structure. The correct filter coupling matrix may thus be identified by forcing signs (+/−) and magnitudes of the couplings. For example, the +/− signs of the correct filter coupling matrix may come from the topology of the filter 220, such that the correct filter coupling matrix has as many zeros as there are resonators in the tunable filter 220 and as many peaks as there are couplings in the tunable filter 220. More information on deriving the filter coupling matrix from S-parameters may be found from "*Extraction of Unloaded Q and Coupling Matrix From Measurements on Filters With Large Losses*", by Giuseppe Macchiarella, in IEEE Microwave and Wireless Components Letters, vol. 20, no. 6, June 2010, pp. 307-309.

Then, in step 302, the control apparatus 200 may compare the determined filter coupling matrix against a reference coupling matrix. The reference coupling matrix may be defined from the obtained at least one reference characteristic. For example, the reference characteristic(s) may directly indicate the reference coupling matrix, or the control apparatus 200 may itself estimate/calculate the reference coupling matrix on the basis of the reference characteristic(s). In the latter case, the reference characteristic(s) may comprise, e.g., the S-parameters related to the output of the reference filter.

That is, in step 302, the tuning algorithm of the control apparatus 200 may compare the coupling matrix produced from the golden unit measurement data to the coupling matrix produced from the current measurement data from the device under tuning. Such comparison is shown in FIG. 4, in which an error function of the tunable filter 220 with respect to the golden unit (i.e. the reference filter) is shown. The error function may indicate how the couplings of the filters (tunable filter and the reference filter) differ from each other. The couplings may refer to the couplings of the input and output of the filters as well as to the couplings between the plurality of resonators of the filters. The topology of the reference filter may be the same as that of the tunable filter 220. That is, the reference filter is of the same kind as the tunable filter 220. The dotted curve of the upper graph may be derived from the coupling matrix of the tunable filter 220, whereas the solid curve of the upper graph may be derived from the reference coupling matrix of the reference filter. The bottom graph then depicts the difference between the two curves.

The aim of the filter tuning process may be to have these two curves to coincide as much as possible and at least that the maximum error between these curves is within the predetermined tuning accuracy. Therefore, in step 304, upon detecting based on the comparison of step 302 that the filter coupling matrix does not match with the reference coupling matrix, the control apparatus 200 may proceed with determining the tuning instructions for the tunable filter 220. This may mean that the tuning algorithm may calculate the differences (as shown in the bottom graph of FIG. 4) and convert these differences into tuning element position changes, such as tuning screw angle position changes. The tuning instructions may then indicate to adjust the tuning elements so that the coupling matrices would coincide as much as possible. It may have been empirically or mathematically modelled how each tuning element is to be adjusted when the outcome of the comparison step 106 is known. For example, if the coupling matrix of the filter 220 under tuning shows a higher value (by a certain amount) for a given coupling than the reference coupling matrix, the tuning algorithm of the control apparatus 200 may know how the corresponding tuning element of the filter 220 is to be adjusted.

It may be noted that although the description is written by explaining the comparison step with the example of coupling matrices, there may be, in addition or instead of, one or more other characteristics under comparison. One of these characteristics may comprise one or more parameters of the time-domain-reflectometer (TDR) measurements.

Let us then consider the tuning parameters of the filter 220. These are the parameters that may be adjusted in order to make the tunable filter 220 to correspond with the reference filter. In an embodiment, the tuning parameters may comprise at least one of the following: a frequency of a resonator of the filter 220, a coupling between two resonators of the filter 220, a coupling of an input of the filter 220, and a coupling of the output of the filter 220. It may be noted that the filter 220 may comprise a plurality of resonators coupled to each other, as illustrated in FIGS. 5A to 5C, where small circles represent tunable resonator-resonator couplings ($C_{M,N}$) between resonators M and N, and large circles represent tunable resonance frequencies ($F_M$) of a resonator M. In addition, the Figures show $C_{IN}$ representing the coupling of the input. In addition, although not shown in FIGS. 5A to 5C, one tunable parameter is $C_{OUT}$ representing the coupling of the output. It may be noted that frequency of one resonator is a different tuning parameter than frequency of another resonator of the same filter 220. Also it may be noted that the coupling between two resonators may be a coupling between two adjacent resonators or a coupling between two nonadjacent resonators. The tuning instructions comprise instructions for adjusting at least one of these tuning parameters of the filter 220.

In an embodiment, the control apparatus 200 may obtain information on how an adjustment of a specific tuning parameter affects the output 222 of the tunable filter. This may be important in knowing which tuning parameter(s) to change and how much. Such affect may be empirically derived and pre-set to the control apparatus 200. The control apparatus 200 may store such data for a plurality of filter types, so that each time a given filer 220 is brought to tuning, the control apparatus 200 may select the data related to this specific type of filter under tuning. Thus, the control apparatus 200 may know how a given tuning parameter needs to be adjusted to reach the desired effect.

In an embodiment, the control apparatus 200 may obtain information on interrelationships between different tuning parameters of the filter, the information indicating how an adjustment of a given tuning parameter affects the tuning of another tuning parameter. As said, tuning parameters of the filter 220 may comprise resonator-to-resonator coupling values and loaded resonance frequencies of resonators. In most cases, tuning of a single tuning parameter may not affect only the corresponding tunable frequency or coupling, but also one or more neighbouring tuning parameters. These cross-effects (i.e. interrelationships) between different tuning parameters may be measured or modelled with analytic functions beforehand, for example by studying the golden unit, and stored to the memory 204 of the control apparatus 200.

FIGS. 5A and 5C show some examples of interrelationships between the tuning parameters. For example, as shown in FIG. 5A, tuning a cross-coupling $C_{1,3}$ may also affect the tuning of the tuning parameters $F_1$, $F_2$, and $F_3$ (frequencies) and the tuning parameters $C_{1,2}$ and $C_{2,3}$ (couplings). In such case, the affected neighboring tuning parameters comprise at least these tuning parameters $F_1$, $F_2$, and $F_3$, $C_{1,2}$ and $C_{2,3}$, as shown with dotted lines in FIG. 5A.

In FIG. 5B, tuning the couplings C between adjacent resonators affects also resonator frequencies F, and possibly also to next couplings. For example, tuning the coupling $C_{2,3}$ may affect also in determining the tuning instructions for the tuning of the coupling $C_{1,2}$ and/or $C_{3,4}$.

FIG. 5C then shows that tuning the input coupling $C_{IN}$ may also affect the tuning of the frequency $F_1$ and the coupling $C_{12}$.

In one embodiment, the information on the interrelationships indicates how the adjustment of a frequency $F_N$ of a given resonator N affects the tuning of a frequency $F_{N+1}$ of a neighbouring resonator N+1 and/or N−1. In one embodiment, the information on the interrelationships indicates how the adjustment of a frequency $F_N$ of a given resonator N affects the tuning of neighbouring couplings $C_{N,N+1}$ and $C_{N-1,N}$. In one embodiment, the information on the interrelationships indicates how the adjustment of a coupling $C_{N,N+1}$ affects the tuning of a frequency $F_N$ or $F_{N+1}$. In one embodiment, the information on the interrelationships indicates how the adjustment of a coupling $C_{N,N+1}$ affects the tuning of the neighbouring coupling parameters $C_{N-1,N}$ or $C_{N+1,N+2}$. Same type of information may be obtained between the resonator N and the resonators N+2, N−2m N+3, N−3, etc. Similarly, same type of relationships may be obtained between tuning the input coupling $C_{IN}$ and the tuning parameters in proximity of the input, such as at least the frequency and couplings related to the neighbouring resonator #1. Similarly, same type of relationships may be obtained between tuning the output coupling $C_{OUT}$ and the tuning parameters in proximity of the output, such as at least the frequency and couplings related to the neighbouring resonator #LAST.

If these interactions/interrelationships are not taken into account, simultaneous/parallel tuning of more than one tuning parameters may be difficult, because the tuning may start to oscillate or the tuning may converge very slowly. However, as the control apparatus 200 may be aware of the interrelationships between different tuning parameters, the control apparatus 200 may determine the tuning instructions further on the basis of this information. Moreover, the tuning instructions may comprise instructions to tune more than one parameter simultaneously, e.g. tuning more than one tuning element of the filter 220 within one tuning cycle. In one embodiment, the calculated differences of FIG. 4 between the golden unit and the tunable filter 220 may be corrected with matrices complying with secondary effect correction terms and/or functions between all related tuning parameters. This may provide the advantage that the tuning of more than one tuning parameter (possibly all tuning parameters) may be done in parallel, i.e. simultaneously. This may speed up the tuning process.

As an example related to the embodiment in which the interrelationships are taken into account, let us assume that the comparison step 106 indicates that couplings between resonators #2 and #3 ($C_{2,3}$) and between #3 and #4 ($C_{3,4}$) do not coincide with the reference couplings and, consequently need adjustment. In such case the decision on how the coupling $C_{3,4}$ is to be changed is determined on the basis of the offset between the tunable filter 220 and the golden unit (i.e. comparison step 106), but also on the basis of how the coupling $C_{2,3}$ is to be tuned. Moreover, even though there may not be any offset in the coupling $C_{4,5}$, it may be determined how the adjustment of the coupling $C_{3,4}$ (and the adjustment of the coupling $C_{2,3}$) affects the coupling $C_{4,5}$. Consequently, if changes are needed, the tuning instructions comprise instructions to adjust also this coupling $C_{4,5}$. Similar determinations may be done for all of the resonators and for all of the tuning parameters, and between different tuning parameters. It should be noted also that adjusting the coupling C may require some adjustments in the frequency-related tuning parameters as well. However, as said, it may have been previously measured how the change of a given tuning parameter affects the other tunable parameters (including parameters of the same resonator and in the other resonators).

In one embodiment, the control apparatus 200 may obtain (e.g. determine or receive information of) a threshold indicating a distance above which the interrelationships between different tuning parameters are not considered. For example, in case tuning of the frequency of a resonator #1 affects very little (e.g. less than tuning accuracy) to resonator #3, then tuning of the resonator #1 need not be taken into account when considering how to adjust the frequency of resonator #3. This threshold may depend on the type of filter 220 under tuning. For example, the topology of the filter may affect the threshold. Thus, the control unit 200 may store different thresholds for different filters. Moreover, the threshold may be different depending on how much a given tuning parameter is adjusted. For example, adjusting a given parameter a lot may cause a larger threshold, whereas adjusting the same parameter only a little may cause a smaller threshold. Still further, the threshold may be different for different tuning parameters. For example, adjusting the coupling C may cause a further-reaching effect than adjusting the frequency F.

In one embodiment, the threshold is given at a resonator accuracy. This may correspond to a physical distance. For example, for a given tuning parameter and/or for a given type of filter 220, it may have been previously tested how far a given adjustment causes measurable effects. As an example, adjusting the frequency F4 (i.e. the frequency F of a resonator #4) may cause effects to resonators #2, #3, #5, and #6, but the effect is negligible for resonators #1, #7, #8, . . . . Therefore, the threshold in this case may be 2 resonators. In other words, the threshold may indicate which resonators of the filter 220 or which other tuning parameters of the filter 220 are affected by a change of a given tuning parameter. As said, this threshold may be different depending on which tuning parameter is adjusted, how much the tuning parameter is adjusted, and which type of filter is under tuning.

In an embodiment, the tuning may be performed in a plurality of cycles, iteratively. As shown in FIG. 1 with the dotted line, each cycle may comprise steps of re-determining the at least one characteristic on the basis of the input data from the filter analyser 230 (step 102 and 104), determining new tuning instructions for the tunable filter 220 (step 106), and applying the new tuning instructions in adjusting the filter 220 (step 108). This cycle may be repeated until the filter 220 meets the product specifications. A typical duration of one tuning cycle is 0.5-1 seconds.

The control apparatus 200 may consider that the tuning of the filter 220 is accomplished when the at least one redetermined characteristic matches with the at least one reference characteristic according to the predetermined tuning accuracy. When this is detected, the process does not continue to step 108, but to step 110 in which the tuning is considered ready/accomplished. According to the proposed automated tuning solution, the filter 220 may be tuned in less than a minute.

In an embodiment, the filter 220 comprises a plurality of branches. For such a multiplexed filter, the tuning may be performed branch-by-branch. In an embodiment, this may be done by short circuiting those filter branches that are not under tuning.

Let us then look in more details about the hardware of the proposed automated tuning solution. As said, the system of FIG. 2 may comprise the control apparatus 200, the filter tuning unit 240, the filter 220 under tuning, and the filter analyzer 230.

In an embodiment, the filter tuning unit 240 may comprise at least one motor for adjusting the at least one tuning element of the filter 220. In an embodiment, the at least one motor comprises a step motor. In an embodiment, the at least one tuning element may comprise at least one screw. As the screw is turned, as shown with reference numeral 244 in FIG. 2, the air space of the corresponding resonator may change. This may change, e.g., the frequency F of the resonator.

Figure 6:
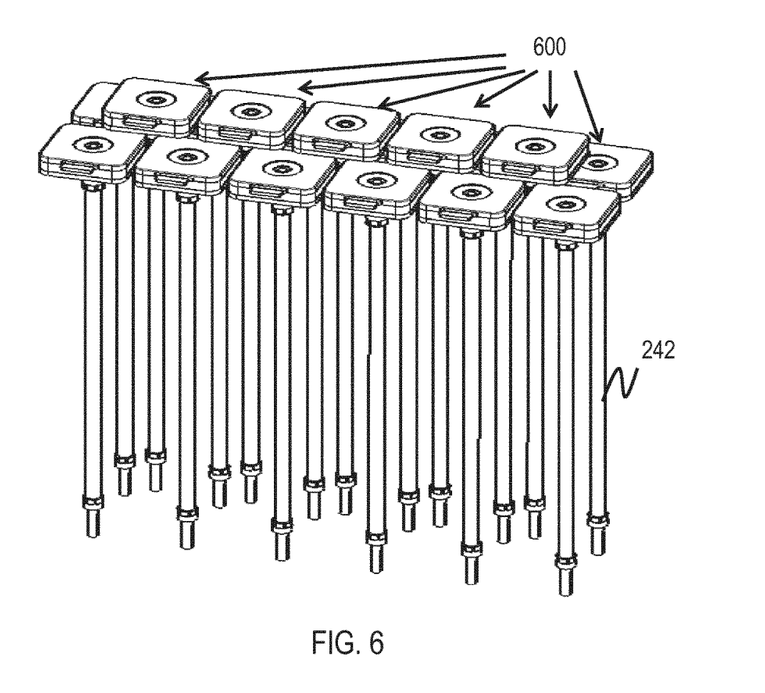
FIG. 6 depicts a filter tuning unit according to an embodiment.

The at least one motor may, in an embodiment, be for screwing at least one of a plurality of screw drivers 242 of the filter tuning unit 240. This is shown with more details in FIG. 6 which shows the motors 600, each motor being for rotating the corresponding screw driver 242. The tuning instructions of step 106 of FIG. 1 may be for instructing each motor 600 to turn the screw driver 242 a given amount or not to turn the corresponding screw driver 242 at all. The motors 600 may be located in at least two levels in order to save space, as shown in FIG. 6. Likewise, the embodiment allows the tuning screws of the filter 220 to locate close to each other.

The screw drivers 242 may comprise flexible shafts. The flexible shafts and screw driver bits may, in an embodiment, be integrated to the motors 600. A tuning control circuitry 214 may be for rotating the screw drivers and it may rest within the control apparatus 200 or it may be a physically separate element coupled to both the control apparatus 200 and the motors 600. In one embodiment, the tuning control circuitry 214 may rest within the filter tuning unit 240. The tuning control circuitry 214 may create control signals for the stepper motors 600 according to the tuning instructions. The flexible shafts may be beneficial because then the proposed solution may easily be taken in use for several different kinds of filters 220. Furthermore, such embodiment with flexible shafts may enable good access to filter's 220 tuning screws that are close to each other.

Figure 7:
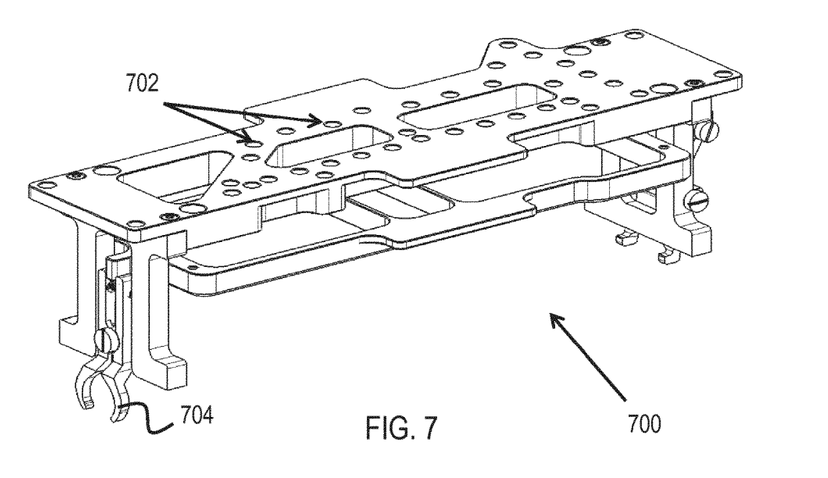
FIG. 7 illustrates a product specific adapter plate according to an embodiment.

In order to enable the use of the proposed system for many types of filters 220, the filter tuning unit 240 may further comprise a filter specific adapter plate 700, as shown in FIG. 7. The plate 700 may be for providing through-holes 702 coinciding with the locations of tuning screws of a given tunable filter 220. The at least one screw driver 242 may then penetrate the at least one through-hole 702. As the screw drivers employ flexible shafts, the screw driver shaft(s) which is/are not used for tuning this particular filter 220, may be bended to the side or removed from the filter tuning unit 240. The plate 700 may not provide any through-holes 702 at those locations which do not have any tuning elements on the filter 220. The plate 700 may thus simplify the use of the screw drivers 242 for different kinds of filters, as the plate 700 aligns the screw drivers 242 with the tuning screws of the filter 220. The flexible shafts and the screw driver heads may go through the product specific adapter plate 700 to the top of the filter's 220 tuning screws. The plate 700 may further comprise one or more attachment units 74 for attaching the plate 700 to the filter 220.

In an embodiment, the control apparatus 200 obtains an indication of at least one loose tuning screw of the filter 220. A loose tuning screw means that the screw is not properly locked by product mechanics, which may cause a product failure at the customer. The tuning screws have to be locked after tuning sequence in order to ensure good product quality. Detecting the loose tuning screws manually may be cumbersome. Thus, it may be beneficial to detect the loose tuning screws automatically during the automatic tuning process. Then, the control apparatus 200 may provide an indication of the loose tuning screw to a user.

In this manner, the plurality of automated screwdrivers 242 may be used to adjust tunable parameters of the filter 242 on the basis of the tuning instructions. As said, in an embodiment, the adjustment comprises turning a plurality of tuning screws of the filter 220 during one cycle. Traditionally it has been thought that such simultaneous tuning of all parameters destroys tuning. However, now the tuning may be done in parallel because the tuning instructions take the interrelationships between different tuning parameters into account, as explainer earlier.

The proposed solution may provide ease of usage with many different type of filters 220. This plate 700 may be the only product specific part in the automated tuning system of FIG. 2. The tuning operator may only need to connect cables and manually attach/de-attach each adapter plate to/from the product 220 and start the automatic tuning operation. In the beginning there may be an initial "guess" adjustment, after which iterations/cycles take place and automatically adjust the filter 220 to produce the correct output. Moreover, the tuning parameters may be filter specific and stored to the memory 204 of the control apparatus 200. Thus, the user need not specify them for each filter manually. The type of the filter is inputted to the control apparatus 200 and the control apparatus 200 may then select the correct tuning parameters, interrelationships, etc. from the memory 204 and start the tuning process.

As a result of the proposed tuning process, the total tuning time may be shorter compared to manual tuning by persons or other prior art solutions. Further, the solution may enable better quality products (product is reliably tuned according to product specifications), better production capacity (less manual tuning stations), better utilization rate for network analysers, and faster product ramp-up times.

There is also proposed the system (e.g. a tuning arrangement) of FIG. 2, comprising the filter analyser 230 for measuring the output 222 of the filter 220 and providing information of the output 222 to the control apparatus 200. The control apparatus 200 may, as explained above, obtain information indicating the at least one reference characteristic, obtain input data from the filer analyser 230, the input data relating to the output of the tunable filter 220, determine the at least one characteristic of the tunable filter 220 based on the input data, determine tuning instructions for the tunable filter 220 upon detecting that the at least one determined characteristic does not match with the at least one reference characteristic, and output the tuning instructions to the filter tuning unit 240 for tuning the filter 220 according to the tuning instructions obtained.

The control apparatus 200 may comprise a control circuitry (CTRL) 202, such as at least one processor, and at least one memory 204 including a computer program code (PROG), wherein the at least one memory and the computer program code (PROG), are configured, with the at least one processor, to cause the control apparatus 200 to carry out any one of the described processes. The memory 204 may be implemented using any suitable data storage technology, such as semiconductor based memory devices, flash memory, magnetic memory devices and systems, optical memory devices and systems, fixed memory and removable memory. The memory 204 may store the tuning algorithm, information on the interrelationships and tuning parameters for a variety of different products, and the information of different reference filters (golden units).

The apparatus 200 may also comprise a user interface 208 comprising, for example, at least one keypad, a microphone, a touch display, a display, a speaker, etc. The user interface 208 may be used to control the apparatus 200 by the user and for showing information to the user.

The control circuitry 202 may comprise an input analysis circuitry 210 for analysing the input data received from the filter analyser 230, for example. The circuitry 202 may, e.g., derive the filter coupling matrix of the filter 220 on the basis of the input data.

A tuning instructions circuitry 212 may be for deciding whether to stop the tuning (when the filter 220 is tuned to specification) or to determine new tuning instructions (when the filter 220 is not yet tuned). The tuning instructions circuitry 212 may also be responsible of determining the tuning instructions.

A tuning control circuitry 214 may then be for performing the adjustments of the tuning parameters according to the tuning instructions. However, as shown in FIG. 2, the circuitry 214 need not be inside the control apparatus 200 and it may be either a physically separate unit or be within the filter tuning unit 240. The tuning control circuitry 214 may be coupled to the motors 600 such that the motors 600 may be instructed to rotate the screw drivers as indicated by the tuning instructions.

As used in this application, the term 'circuitry' refers to all of the following: (a) hardware-only circuit implementations, such as implementations in only analog and/or digital circuitry, and (b) combinations of circuits and soft-ware (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device.

In an embodiment, at least some of the processes described may be carried out by an apparatus comprising corresponding means for carrying out at least some of the described processes. Some example means for carrying out the processes may include at least one of the following:

detector, processor (including dualcore and multiple-core processors), digital signal processor, controller, receiver, transmitter, encoder, decoder, memory, RAM, ROM, software, firmware, display, user interface, display circuitry, user interface circuitry, user interface software, display software, circuit, antenna, antenna circuitry, and circuitry.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chip set (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

Embodiments as described may also be carried out in the form of a computer process defined by a computer program or portions thereof. Embodiments of the methods described may be carried out by executing at least one portion of a computer program comprising corresponding instructions. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a person of ordinary skill in the art.

Even though the invention has been described above with reference to an example according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. A method for tuning a radio or microwave frequency filter by a control apparatus, comprising:
    obtaining, by the control apparatus, information indicating at least one reference characteristic;
    obtaining input data, the input data relating to an output of the tunable filter;
    determining, based on the input data, at least one characteristic of the tunable filter, wherein the input data comprises at least one measured scattering parameter of the output of the tunable filter;
    upon detecting that the at least one determined characteristic does not match with the at least one reference characteristic, determining tuning instructions for the tunable filter; and
    applying the tuning instructions in adjusting the tunable filter.

2. The method of claim 1, wherein the reference characteristic is obtained from a reference filter, which represents a filter which is tuned to produce an acceptable reference output.

3. The method of claim 1, wherein determining the at least one characteristic further comprises:
    determining, based on the input data, a filter transfer function; and determining, as the at least one characteristic, a filter coupling matrix on the basis of a structure of the tunable filter and the filter transfer function.

4. The method of claim 3, further comprising:
    comparing the determined filter coupling matrix against a reference coupling matrix defined by the at least one reference characteristic; and
    upon detecting, based on the comparison, that the filter coupling matrix does not match with the reference coupling matrix, determining the tuning instructions for the tunable filter.

5. A computer program product embodied on a distribution medium readable by an apparatus and comprising program instructions which, when loaded into and executed by the apparatus, cause the apparatus to perform the method according to claim 1.

6. The method of claim 1, wherein tuning instructions comprise instructions for adjusting at least one tuning parameter of the filter, wherein the tuning parameter comprises at least one of a frequency of a resonator of the filter, a coupling between two resonators of the filter, a coupling of an input of the filter, and a coupling of the output of the filter.

7. The method of claim 1, wherein the adjustment comprises adjusting a plurality of tuning parameters of the filter in parallel.

8. The method of claim 1, further comprising:
    obtaining information on interrelationships between different tuning parameters of the filter, the information indicating how an adjustment of a given tuning parameter affects the tuning of another tuning parameter; and
    determining tuning instructions further on the basis of the information on interrelationships.

9. The method of claim 8, further comprising:
    obtaining a threshold indicating a distance above which the interrelationships between different tuning parameters are not considered.

10. The method of claim 1, further comprising:
    performing the tuning of the filter in a plurality of cycles, each cycle comprising re-determining the at least one characteristic on the basis of new input data, determining new tuning instructions for the tunable filter, and applying the new tuning instructions in the adjustment of the tunable filter; and considering that the tuning of the filter is accomplished when the at least one re-determined characteristic matches with the at least one reference characteristic according to a predetermined tuning accuracy.

11. A method for tuning a radio or microwave frequency filter by a control apparatus, comprising:
obtaining, by the control apparatus, information indicating at least one reference characteristic;
obtaining input data, the input data relating to an output of the tunable filter;
determining, based on the input data, at least one characteristic of the tunable filter, wherein determining the at least one characteristic further comprises: determining, based on the input data, a filter transfer function, and determining, as the at least one characteristic, a filter coupling matrix on the basis of a structure of the tunable filter and the filter transfer function;
upon detecting that the at least one determined characteristic does not match with the at least one reference characteristic, determining tuning instructions for the tunable filter;
applying the tuning instructions in adjusting the tunable filter;
comparing the determined filter coupling matrix against a reference coupling matrix defined by the at least one reference characteristic; and
upon detecting, based on the comparison, that the filter coupling matrix does not match with the reference coupling matrix, determining the tuning instructions for the tunable filter.

12. The method of claim 11, wherein the input data comprises at least one measured scattering parameter of the output of the tunable filter.

13. The method of claim 11, further comprising:
obtaining information on interrelationships between different tuning parameters of the filter, the information indicating how an adjustment of a given tuning parameter affects the tuning of another tuning parameter; and
determining tuning instructions further on the basis of the information on interrelationships.

14. The method of claim 11, further comprising:
performing the tuning of the filter in a plurality of cycles, each cycle comprising re-determining the at least one characteristic on the basis of new input data, determining new tuning instructions for the tunable filter, and applying the new tuning instructions in the adjustment of the tunable filter; and
considering that the tuning of the filter is accomplished when the at least one re-determined characteristic matches with the at least one reference characteristic according to a predetermined tuning accuracy.

15. A computer program product embodied on a distribution medium readable by an apparatus and comprising program instructions which, when loaded into and executed by the apparatus, cause the apparatus to perform the method according to claim 11.

16. A method for tuning a radio or microwave frequency filter by a control apparatus, comprising:
obtaining, by the control apparatus, information indicating at least one reference characteristic;
obtaining input data, the input data relating to an output of the tunable filter;
determining, based on the input data, at least one characteristic of the tunable filter;
upon detecting that the at least one determined characteristic does not match with the at least one reference characteristic, determining tuning instructions for the tunable filter;
applying the tuning instructions in adjusting the tunable filter;
obtaining information on interrelationships between different tuning parameters of the filter, the information indicating how an adjustment of a given tuning parameter affects the tuning of another tuning parameter; and
determining tuning instructions further on the basis of the information on interrelationships.

17. The method of claim 16, wherein the input data comprises at least one measured scattering parameter of the output of the tunable filter.

18. The method of claim 16, wherein:
determining the at least one characteristic further comprises determining, based on the input data, a filter transfer function; and determining, as the at least one characteristic, a filter coupling matrix on the basis of a structure of the tunable filter and the filter transfer function; and
the method further comprises:
comparing the determined filter coupling matrix against a reference coupling matrix defined by the at least one reference characteristic; and
upon detecting, based on the comparison, that the filter coupling matrix does not match with the reference coupling matrix, determining the tuning instructions for the tunable filter.

19. The method of claim 16, wherein tuning instructions comprise instructions for adjusting at least one tuning parameter of the filter, wherein the tuning parameter comprises at least one of a frequency of a resonator of the filter, a coupling between two resonators of the filter, a coupling of an input of the filter, and a coupling of the output of the filter.

20. The method of claim 16, further comprising:
performing the tuning of the filter in a plurality of cycles, each cycle comprising re-determining the at least one characteristic on the basis of new input data, determining new tuning instructions for the tunable filter, and applying the new tuning instructions in the adjustment of the tunable filter; and
considering that the tuning of the filter is accomplished when the at least one re-determined characteristic matches with the at least one reference characteristic according to a predetermined tuning accuracy.

21. A computer program product embodied on a distribution medium readable by an apparatus and comprising program instructions which, when loaded into and executed by the apparatus, cause the apparatus to perform the method according to claim 16.

* * * * *